United States Patent
Zhang et al.

(10) Patent No.: US 11,621,727 B2
(45) Date of Patent: Apr. 4, 2023

(54) DECODING SYSTEMS AND METHODS FOR LOCAL REINFORCEMENT

(71) Applicant: SK hynix Inc., Gyeonggi-do (KR)

(72) Inventors: Fan Zhang, Fremont, CA (US); Seyhan Karakulak, San Jose, CA (US); Aman Bhatia, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/339,285

(22) Filed: Jun. 4, 2021

(65) Prior Publication Data
US 2022/0393703 A1 Dec. 8, 2022

(51) Int. Cl.
  H03M 13/37  (2006.01)
  H03M 13/00  (2006.01)
  G06F 11/10  (2006.01)

(52) U.S. Cl.
  CPC ..... *H03M 13/3707* (2013.01); *G06F 11/1076* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 8,132,065 B2 | 3/2012 | Chen et al. | |
| 8,407,553 B2 | 3/2013 | Gunnam | |
| 8,484,535 B2 | 7/2013 | Graef et al. | |
| 8,645,810 B2 | 2/2014 | Sharon et al. | |
| 8,880,987 B2 | 11/2014 | Sharon et al. | |
| 9,459,956 B2 | 10/2016 | Hubris et al. | |
| 10,700,706 B2 | 6/2020 | Zhang et al. | |
| 2008/0168319 A1* | 7/2008 | Lee | H03M 13/3715 714/746 |
| 2019/0288707 A1* | 9/2019 | Kumar | G06F 3/0614 |
| 2020/0136644 A1* | 4/2020 | Zeng | G11C 29/52 |
| 2020/0162108 A1* | 5/2020 | Kim | H03M 13/1575 |

OTHER PUBLICATIONS

Notice of Allowance issued by the USPTO dated Mar. 17, 2022.

\* cited by examiner

*Primary Examiner* — Cynthia Britt
*Assistant Examiner* — Matthew W Wahlin
(74) *Attorney, Agent, or Firm* — IP & T Group LLP

(57) ABSTRACT

Embodiments of the present disclosure provide a scheme for decoding over a small subgraph which highly likely includes some errors. A controller is configured to: control the first decoder to decode the data, read from the memory device, using a parity check matrix for the error correction code; extract one or more subgraphs from the entire bipartite graph of the parity check matrix, which is defined by a plurality of variable nodes and a plurality of check nodes when a particular condition satisfied; and control the second decoder to decode the decoding result of the first decoder using a submatrix of the parity check matrix corresponding to the extracted subgraphs.

16 Claims, 11 Drawing Sheets

DECODING SYSTEMS AND METHODS FOR LOCAL REINFORCEMENT

BACKGROUND

1. Field

Embodiments of the present disclosure relate to decoding schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may use various types of decoders.

SUMMARY

Aspects of the present invention include a system with a reinforced decoder to decode over a small subgraph which highly likely includes some errors and a decoding method thereof.

In one aspect of the present invention, a system includes a memory device storing data encoded with an error correction code and a controller including a first decoder with a first precision and a second decoder with a second precision greater than the first precision. The controller is configured to: control the first decoder to decode the data read from the memory device by using a parity check matrix for the error correction code; extract one or more subgraphs from the entire bipartite graph of the parity check matrix, which is defined by a plurality of variable nodes and a plurality of check nodes when a particular condition satisfied; and control the second decoder to decode the decoding result of the first decoder using a submatrix of the parity check matrix corresponding to the extracted subgraphs.

In another aspect of the present invention, a method for operating a system including a memory device storing data encoded with an error correction code and a controller, includes: controlling a first decoder with a first precision to decode the data read from the memory device, by using a parity check matrix for the error correction code; extracting one or more subgraphs from the entire bipartite graph of the parity check matrix, which is defined by a plurality of variable nodes and a plurality of check nodes when a particular condition satisfied; and controlling a second decoder with a second precision greater than the first precision to decode the decoding result of the first decoder using a submatrix of the parity check matrix corresponding to the extracted subgraphs.

Additional aspects of the present invention will become apparent from the following description.

DETAILED DESCRIPTION

Figure 1:
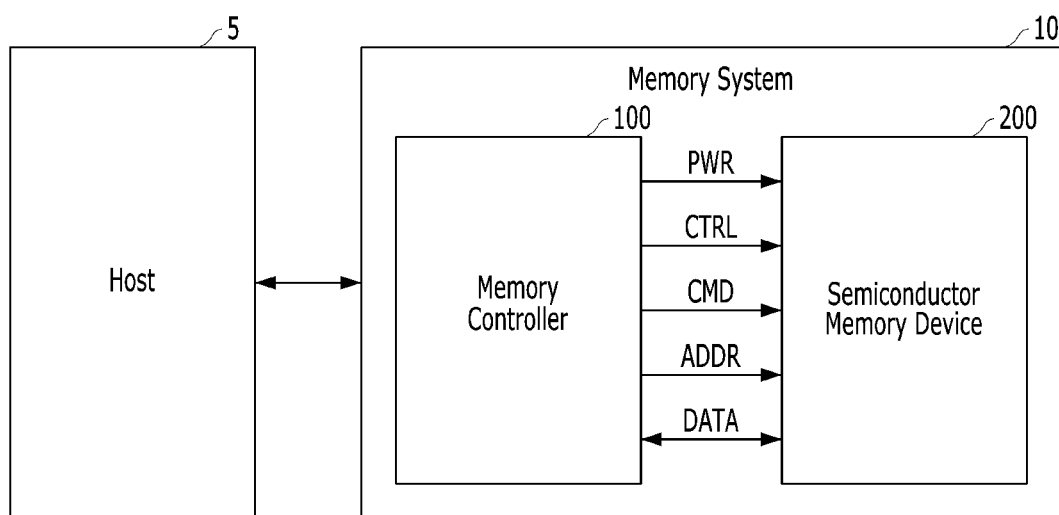
FIG. 1 is a block diagram illustrating a data processing system in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of embodiments of the present invention is provided below along with accompanying figures that illustrate aspects of the present invention. The present invention is described in connection with such embodiments, but the present invention is not limited to any embodiment. The scope of the present invention is limited only by the claims. The present invention encompasses numerous alternatives, modifications and equivalents within the scope of the claims. Numerous specific details are set forth in the following description in order to provide a thorough understanding of the present invention. These details are provided for the purpose of example; the present invention may be practiced according to the claims without some or all of these specific details. For clarity, technical material that is known in technical fields related to the present invention has not been described in detail so that the present invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
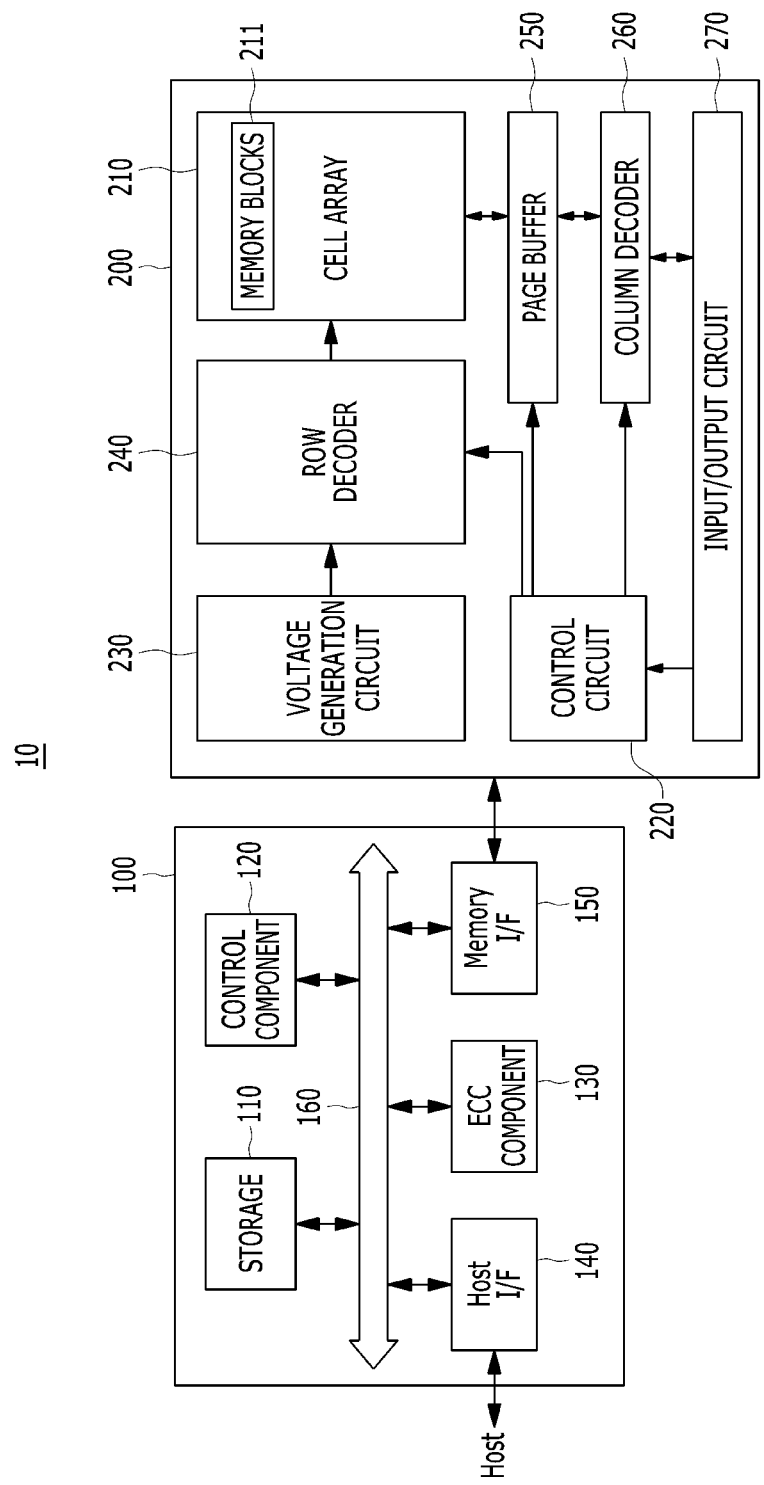
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120 which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200 in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various communication standards or interfaces such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
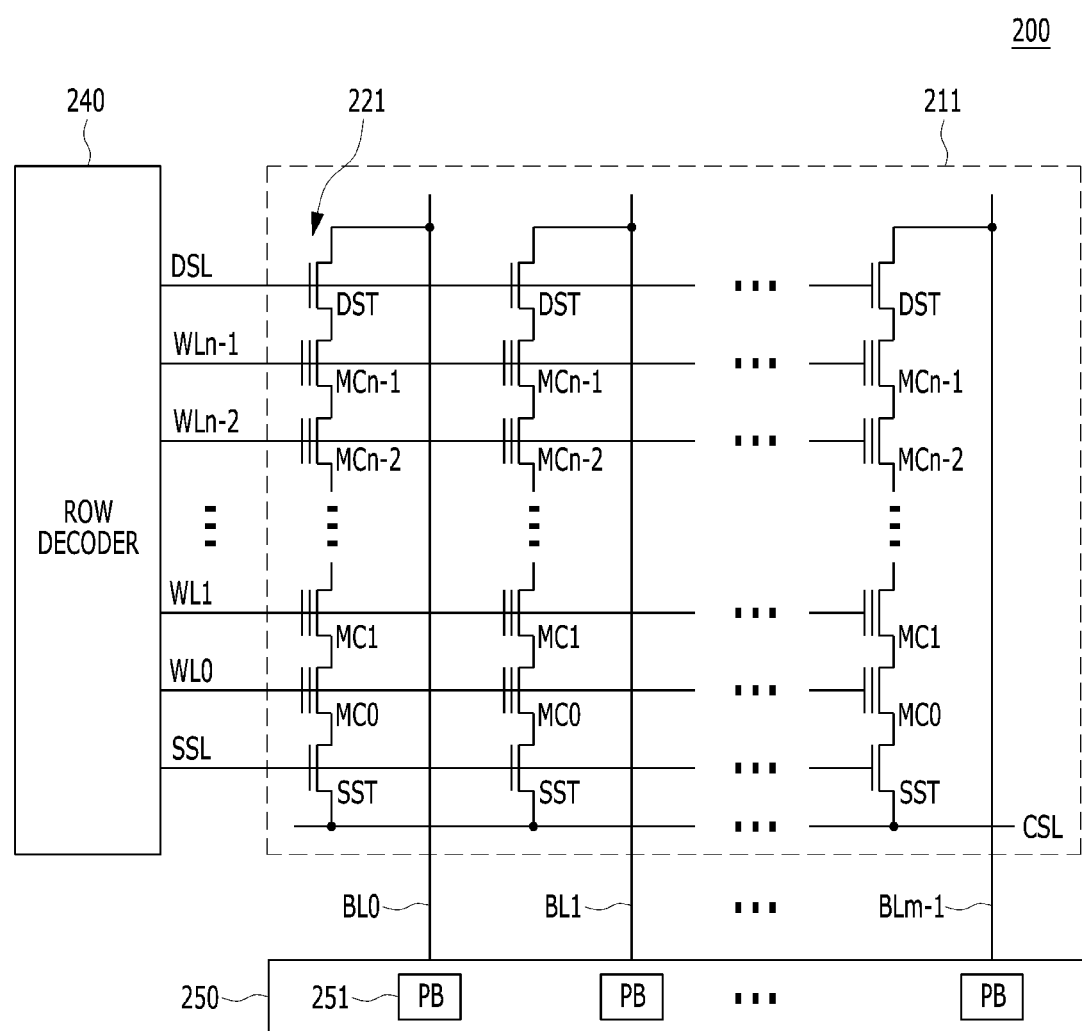
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 may transmit data to and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
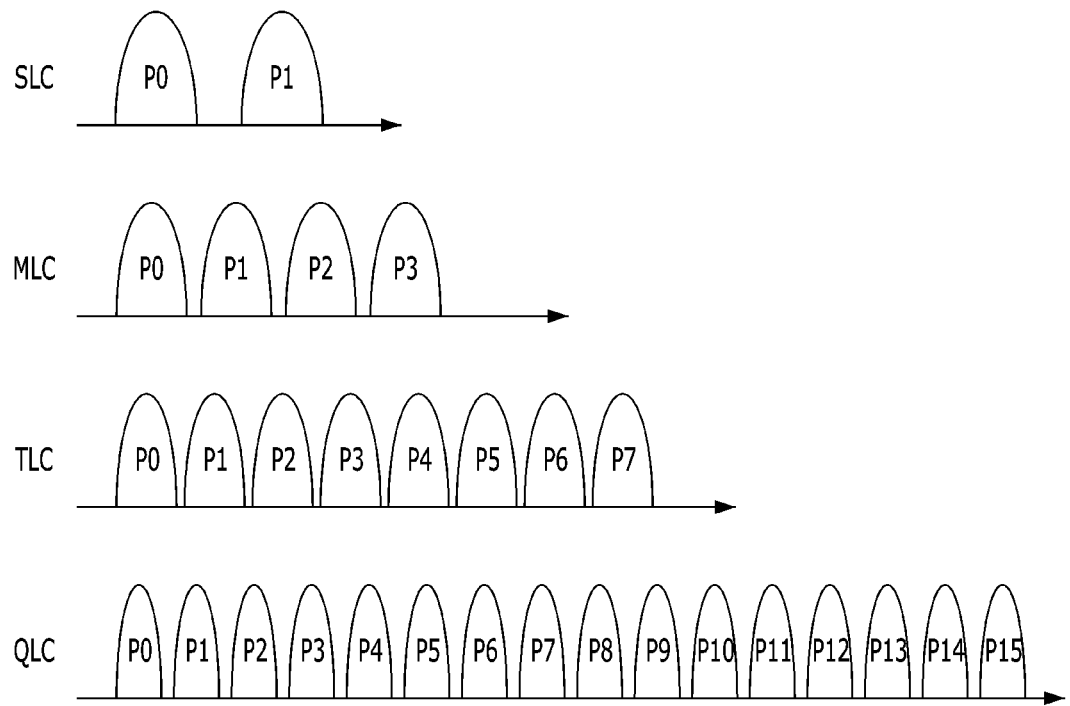
FIG. 4 is a diagram illustrating distributions of states for different types of cells of a memory device in accordance with an embodiment of the present invention.

FIG. 4 is a diagram illustrating distributions of states or program voltage (PV) levels for different types of cells of a memory device in accordance with an embodiment of the present invention.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
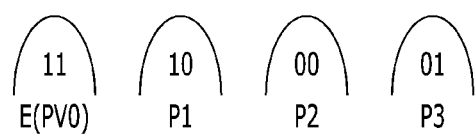
FIG. 5A is a diagram illustrating an example of Gray coding for a multi-level cell (MLC) in accordance with an embodiment of the present invention.

FIG. 5A is a diagram illustrating an example of coding for a multi-level cell (MLC) in accordance with an embodiment of the present invention.

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
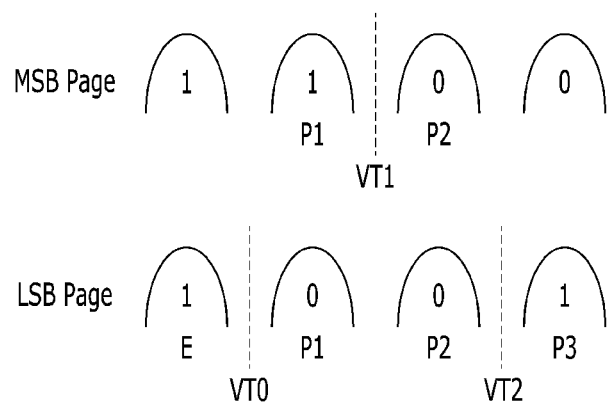
FIG. 5B is a diagram illustrating state distributions for pages of a multi-level cell (MLC) in accordance with an embodiment of the present invention.

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
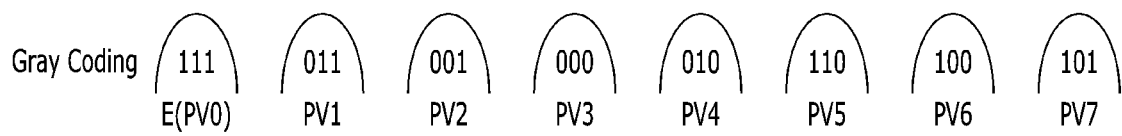
FIG. 6A is a diagram illustrating an example of Gray coding for a triple-level cell (TLC) in accordance with an embodiment of the present invention.

FIG. 6A is a diagram illustrating an example of Gray coding for a triple-level cell (TLC) in accordance with an embodiment of the present invention.

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
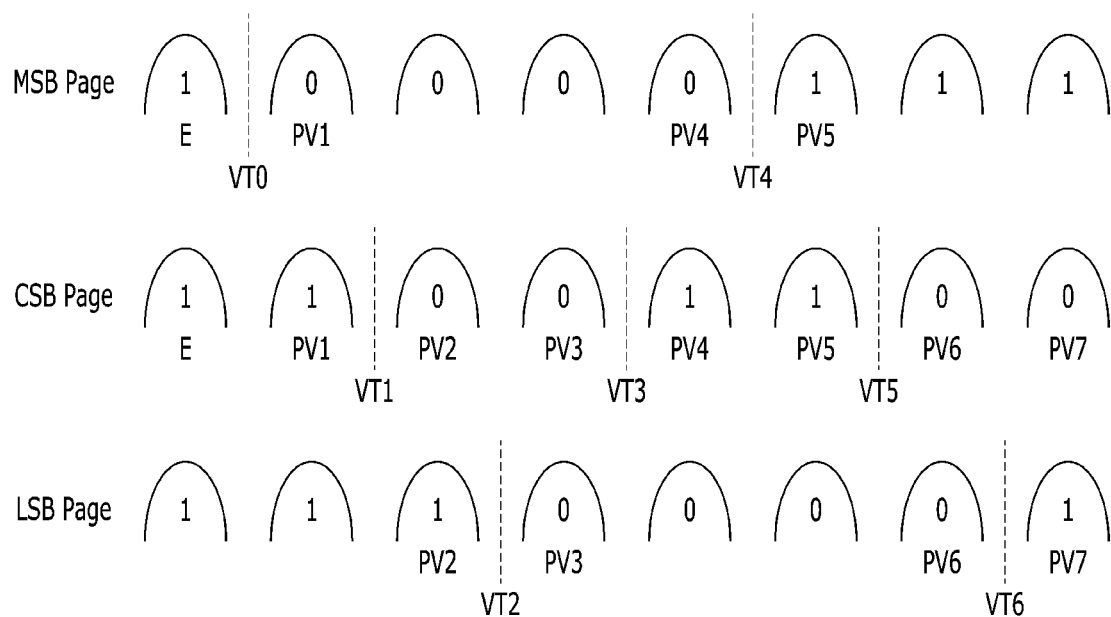
FIG. 6B is a diagram illustrating state distributions for pages of a triple-level cell (TLC) in accordance with an embodiment of the present invention.

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fifth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

Figure 7:
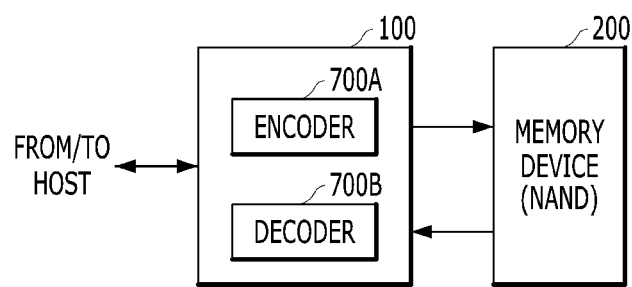
FIG. 7 is a diagram illustrating a memory system in accordance with an embodiment of the present invention.

FIG. 7 is a diagram illustrating a memory system in accordance with an embodiment of the present invention.

Referring to FIG. 7, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 700A, and a decoder 700B. During the program operation, the encoder 700A may perform an encoding operation on the write data based on a set encoding scheme. During the read operation, the decoder 700B may perform a decoding operation on the read data based on a set decoding scheme corresponding to the encoding scheme. The decoding schemes will be described below with reference to FIGS. 8 to 13. Although not shown in FIG. 7, the controller 100 and the memory device 200 may include various other components as shown in FIG. 2 and perform the operations described in FIGS. 1 and 2. In an embodiment, the encoder 700A and decoder 700B may be embodied in the ECC component 130 of the controller 100 shown in FIG. 2. Other suitable arrangements may be employed as well, as described below. In general, the encoder 700A and decoder 700B may be implemented by hardware, software, firmware, or any suitable combination thereof.

One implementation of a memory controller may include two decoders with different precision (or power) in a system-on-chip (SoC). In the illustrated example of FIG. 8, a decoding device 800 may have a layered decoding architecture, which includes a first decoder 810 with a first precision and a second decoder 820 with a second precision greater than the first precision. By way of example and without any limitation, the first decoder 810 may be a bit-flipping (BF) decoder and the second decoder 820 may be a min-sum (MS) decoder. The BF decoder 810 has smaller gate counts (i.e., less area), consumes less power but has weaker error correction capability (i.e., lower precision). The MS decoder 820 has higher gate counts, consumes higher power and can correct more errors than the BF decoder 810 (i.e., higher precision). Once the BF decoder 810 fails to correct a codeword, it may be sent to the MS decoder 820 for a second decoding attempt. Most of the codewords can be decoded by the low-power BF decoder 810, while few codewords (e.g., 1% to 5% of codewords) can be decoded by the high-power MS decoder 820. Thus, this scheme improves energy consumption. However, since both decoders need to be implemented in SoC, gate counts and peak power may be high despite the low energy consumption. In particular, in mobile applications, an error correction code (ECC) decoder engine can occupy more than 60% of SoC gate counts, while mobile applications typically require low gate counts to keep costs low.

Figure 8:
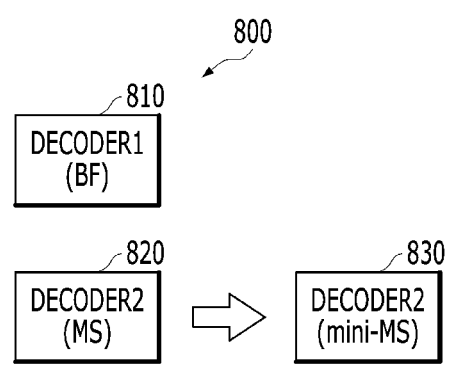
FIG. 8 is a diagram illustrating a decoding device in accordance with an embodiment of the present invention.

Accordingly, embodiments of the present invention provide an architecture of a decoding device including two different decoders and a method for operating the two decoders to address the gate-count and peak-power issues in the decoding device while keeping energy consumption low. Embodiments may be applied to the decoding device 800 including two decoders 810 and 820 with different decoding precision and power as shown in FIG. 8. In an embodiment, the first decoder 810 and the second decoder 820 may be a bit-flipping (BF) decoder and a min-sum (MS) decoder, respectively. In another embodiment, the first decoder 810 and the second decoder 820 may be a low-precision MS decoder and a high-precision MS decoder, respectively. In still another embodiment, the first decoder 810 and the second decoder 820 may be a MS decoder and a Bahl, Cocke, Jelinek and Raviv (BCJR) decoder, respectively. Although embodiments may be implemented in various ways as noted above, embodiments are described for the decoding device 800 including the BF decoder 810 and the MS decoder 820 as shown in FIG. 8. Embodiments may achieve optimality for gate-count, peak power and energy all together in the decoding device.

It has been observed that, for most of the failures from the BF decoder 810, remaining errors are closely inter-connected. The BF decoder 810 falls short correcting such errors because the BF decoder 810 does not generate and propagate reliability information between variable nodes (VNs) and check nodes (CNs) in a bipartite graph (i.e., Tanner graph) of the underlying error correction codes (e.g., low density parity check (LDPC) codes). Further, it has been observed that, once reliability information is generated and passed along edges between variable nodes and check nodes in a particular subgraph of the bipartite graph, which is induced by the small neighborhood of the remaining errors, which are often not many, the remaining errors can be recovered. This observation implies that a full-scale MS decoder, which generates and passes soft messages along the entire graph, is not necessary. Accordingly, embodiments provide a decoding system including a locally reinforced decoder (hereinafter referred to as a mini-MS decoder) to decode over a very small subgraph which highly likely includes some of the remaining errors, while keeping the rest of the graph to be decoded by the BF decoder 810.

Figure 9:
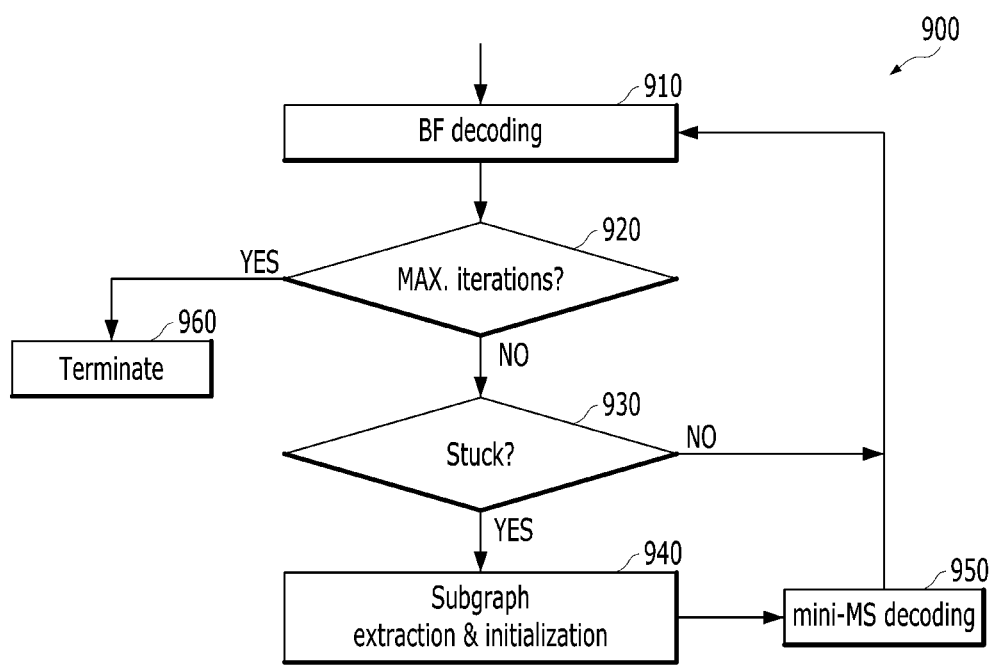
FIG. 9 is a flowchart illustrating a method for operating a decoding device in accordance with an embodiment of the present invention.

FIG. 9 is a flowchart illustrating a method 900 for operating a decoding device in accordance with an embodiment of the present invention. In an embodiment, the decoding device may be the decoding device 800 including the BF decoder 810 and a mini-MS decoder 830 instead of the full-scale MS decoder 820, as shown in FIG. 8.

Referring to FIG. 9, the method 900 may include operations 910 to 960 and may be controlled by the controller 100 in FIG. 7. The controller 100 may read data (or codeword) from the memory device 200 and control the BF decoder 810 to decode the data (910). The BF decoder 810 may perform BF decoding on the data using a parity check matrix for an error correction code (e.g., a linear density parity check (LDPC) code).

The controller 100 may determine whether a particular condition satisfied. In some embodiments, the particular condition may include when the BF decoder 810 gets stuck (930). That is, the mini-MS decoder 830 may be kicked in when the BF decoder 810 gets stuck and makes no progress. This condition may be identified by checking the checksum along consecutive decoding iterations by the BF decoder 810. The controller 100 may start the mini-MS decoder 830 when the checksum result is below certain threshold for a large number of iterations of BF decoding (i.e., when the checksum result is less than a set threshold). Alternatively, the controller 100 may start the mini-MS decoder 830 when any oscillations of the BF decoder 810 are detected. This oscillation detection scheme is described in U.S. patent application Ser. No. 17/124,203, entitled "OSCILLATION DETECTION AND MITIGATION IN BIT-FLIPPING DECODERS" which is incorporated by reference herein in its entirety.

When it is determined that the particular condition is satisfied (930, YES), the controller 100 may perform a subgraph extraction and initialization for the mini-MS decoder 830 (940). The controller 100 may extract one or more subgraphs from the entire bipartite graph of the parity check matrix. The bipartite graph may be defined by a plurality of variable nodes and a plurality of check nodes. Each of the subgraphs may be determined based on unsatisfied check nodes and neighbors selected from among multiple neighbors of satisfied check nodes. In some embodiments, the selected neighbors may have a set distance (e.g., distance-1 or distance-2) from the unsatisfied check nodes. Identification and extraction of the subgraph are described in detail below.

The mini-MS decoder 830 may be initialized by either the channel input values or the bit values at the end of the BF decoder 810, or a combination of two.

After performing the subgraph extraction and initialization, the controller 100 may control the mini-MS decoder 830 to decode the data using a submatrix of the parity check matrix corresponding to the extracted subgraph.

In some cases, the subgraph does not contain all of the errors. This means that the global checksum and/or the cyclic redundancy check (CRC) are not satisfied. In such case, after decoding by the mini-MS decoder 830, the BF decoder 810 may continue to decode by taking hard decision (HD) values from the mini-MS decoder 830. In some embodiments, the HD values are obtained by performing hard decision decoding on the output of the mini-MS decoder 830. The HD values include binary values 0 and 1. The iteration between the BF decoder 810 and the mini-MS decoder 830 may continue until a set maximum number of iterations are reached (920). At the end of each BF decoding iteration, the BF decoder 910 may test whether syndromes (e.g., LDPC syndrome and CRC syndrome) are all-zero. When it is determined that the test passes, the BF decoder 910 may be terminated by declaring a success. When it is determined that the maximum number of iterations has been reached (920, YES), the BF decoder 910 may be terminated by declaring a decoding failure (960).

As noted above, the controller 100 may perform subgraph identification and extraction. In some embodiments, the subgraph for the mini-MS decoder 830 to operate over may be defined by the subgraph imposed by the unsatisfied checks (check nodes) and some of the distance-1 neighbors and distance-2 neighbors of the satisfied checks. Distance-1 neighbors of a check node may be variable nodes that are connected to this check node. Distance-2 neighbors of a check node C may be variable nodes that are connected to the same check nodes of the distance-1 neighbors of check node C.

Figure 10:
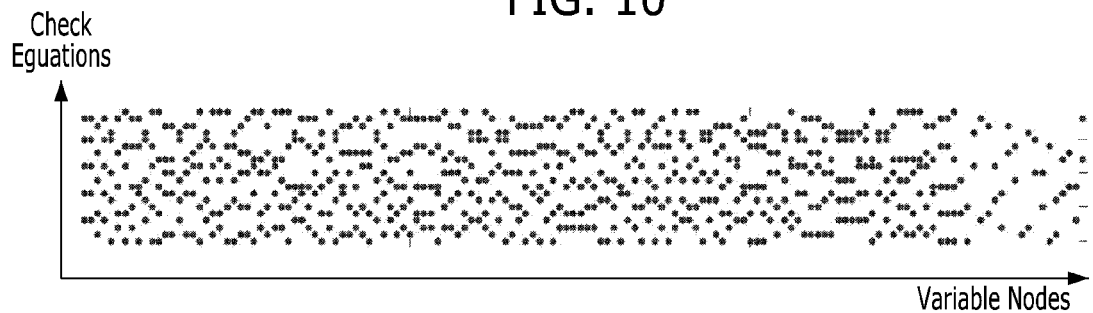
FIG. 10 illustrates a varying degree distribution of a parity check matrix.

In the error floor region, it has been observed that some error patterns occur more frequently compared to most of the error patterns. These patterns and their variants are determined from error patterns of the BF decoder 810. For example, when a parity check matrix may have a varying degree distribution as shown in FIG. 10, it has been studied and observed that certain structures (error patterns) may be extracted from the parity check matrix. In FIG. 10, x-axis represents variable nodes and y-axis represents check equations. Two subgraph extraction algorithms (schemes) are described in detail below. The mini-MS decoder 830 may focus on a smaller graph where most of the errors occur. Such a case may improve the decoding performance when most of the errors show up in the subgraph and the mini-MS decoder 830 may decode the error pattern. The rest of the errors may be corrected when the BF decoder 810 is applied.

Figure 11:
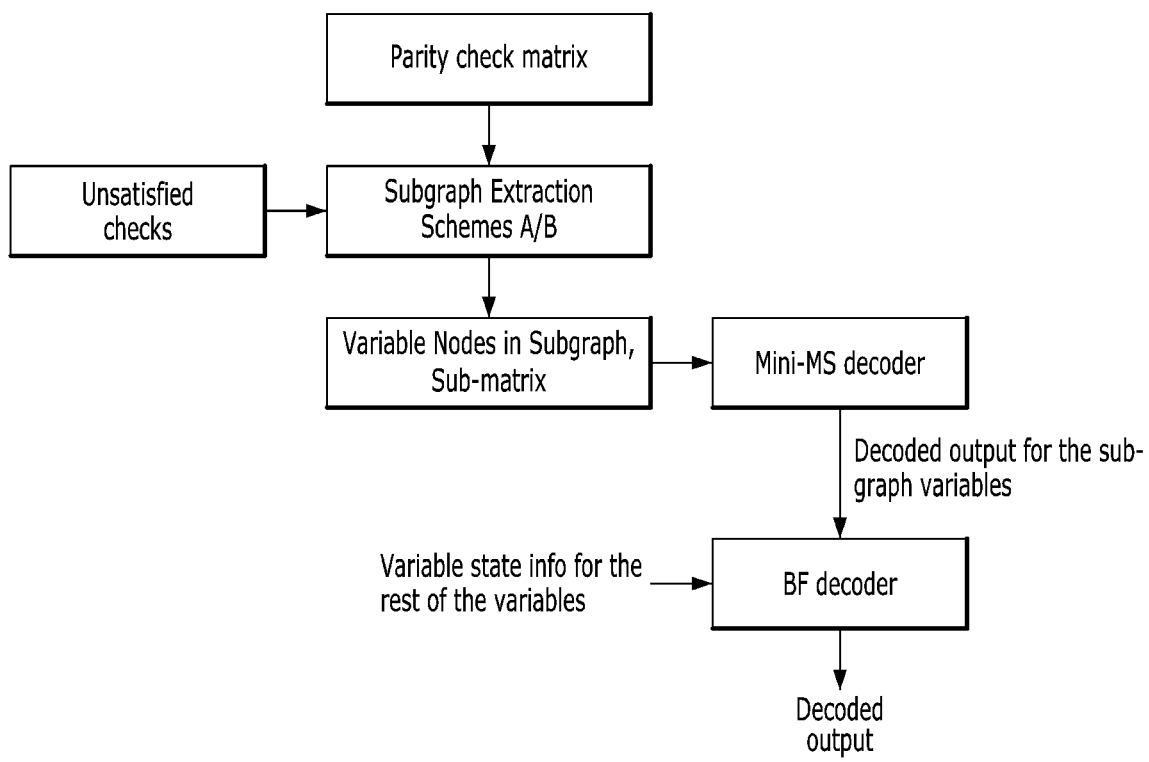
FIG. 11 is a flowchart illustrating a subgraph extraction and its usage by a decoding device in accordance with an embodiment of the present invention.

FIG. 11 is a flowchart illustrating a subgraph extraction and its usage by the decoding device 800, which includes the BF decoder 810 and the mini-MS decoder 830, in accordance with an embodiment of the present invention.

Referring to FIG. 11, two subgraph extraction schemes Scheme A and Scheme B may be controlled by the controller 100 and be used for the mini-MS decoder 830. By way of example and without any limitation, the variable nodes with two different degrees may be considered, which are degree-a and degree-b for the subgraph extraction schemes. Degree-a variable nodes may be the variable nodes which are connected to "a" number of check nodes. Similarly, degree-b variable nodes may be the variable nodes which are connected to "b" number of check nodes. Here, a and b may be integers. In some embodiments, for an irregular LDPC code with more than two unique degrees, the controller 100 may bin multiple degrees into the degree-a category, and remaining degrees into the degree-b category and apply the subgraph extraction algorithms. The controller 100 may target variable nodes in errors with two different degrees, namely degree-a and degree-b, that are at most distance-2 away from one another.

For each of the subgraph extraction schemes, inputs may include a parity check matrix and unsatisfied checks, and outputs may include variable nodes in the subgraph and a submatrix of the parity check matrix corresponding to the subgraph.

The mini-MS decoder 830 may receive outputs in accordance with the selected subgraph extraction scheme and perform MS decoding using the received outputs. The BF decoder 810 may receive the decoding output for the subgraph variable nodes decoded by the mini-MS decoder 830 and state information for the rest of the variable nodes and perform BF decoding using the received decoding output and state information.

Figure 12:
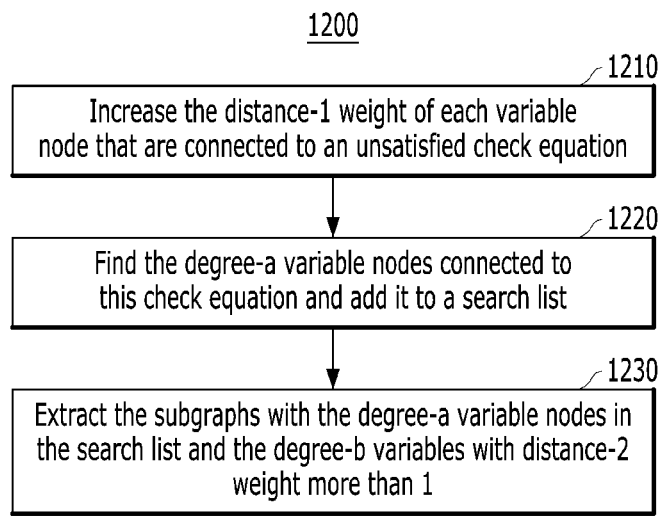
FIG. 12 is a flowchart illustrating a subgraph extraction scheme in accordance with a first embodiment of the present invention.

FIG. 12 is a flowchart illustrating a subgraph extraction scheme (Scheme A) 1200 in accordance with a first embodiment of the present invention.

In FIG. 12, inputs for the subgraph extraction scheme 1200 may include a parity check matrix, the coset to decode and check equations. In the most simplistic form, a coset may include all the vectors that have the same syndrome. Outputs for the subgraph extraction scheme 1200 may include the variables in the subgraph and the corresponding submatrix.

In the illustrated example, the subgraph extraction scheme 1200 may include operations 1210 to 1230 for each of the unsatisfied check equations (nodes) in accordance with the decoding result of the BF decoder 810.

In the operation 1210, the controller 100 may increase the distance-1 weight of each variable node that is connected to an unsatisfied check equation (node).

In the operation 1220, the controller 100 may find the degree-a variable nodes connected to this check equation and add it to a search list. Further, the controller 100 may find the other equations which included the degree-b variables in the search list and were satisfied. Furthermore, the controller 100 may find the degree-b variable nodes that are connected to these satisfied equations and increase their distance-2 weights by a set value (e.g., 1).

In the operation 1230, the controller 100 may extract the subgraphs with the degree-a variable nodes in the search list and the degree-b variables with distance-2 weight more than 1.

It has been observed that, when this subgraph extraction scheme 1200 is applied, 80% of the error patterns were successfully decoded using the mini-MS decoder 830 that is followed by the BF decoder 810. The subgraph extraction scheme 1200 may be generalized for different degree distributions as well as different distances from the unsatisfied check equations.

Figure 13:
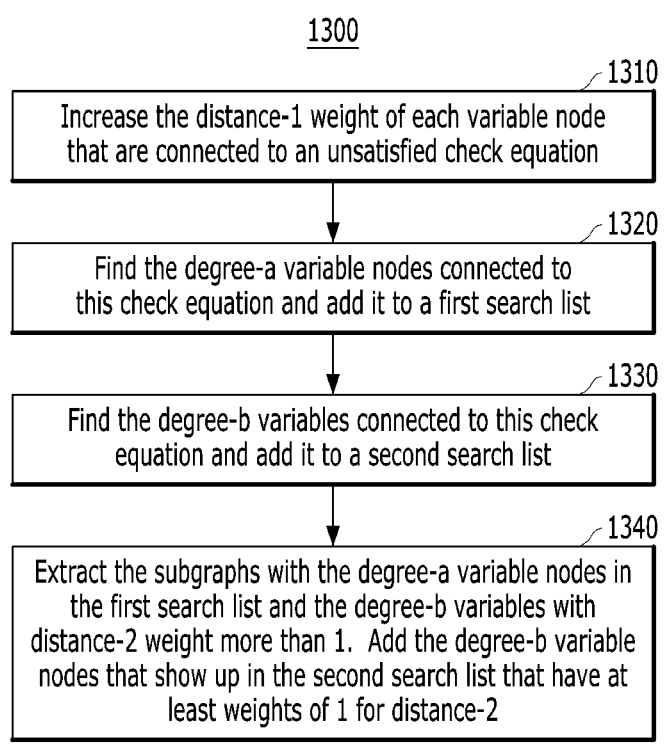
FIG. 13 is a flowchart illustrating a subgraph extraction scheme in accordance with a second embodiment of the present invention.

FIG. 13 is a flowchart illustrating a subgraph extraction scheme (Scheme B) 1300 in accordance with a second embodiment of the present invention.

In FIG. 13, inputs for the subgraph extraction scheme 1300 may include a parity check matrix and unsatisfied checks. Outputs for the subgraph extraction scheme 1300 may include the variables in the subgraph, the coset to decode and the check equations.

In the illustrated example, the subgraph extraction scheme 1300 may include operations 1310 to 1340 for each of the unsatisfied check equations (nodes) in accordance with the decoding result of the BF decoder 810.

In the operation 1310, the controller 100 may increase the distance-1 weight of each variable node that are connected to an unsatisfied check equation.

In the operation 1320, the controller 100 may find the degree-a variable nodes connected to this check equation and add it to a first search list. Further, the controller 100 may find the other equations which included the degree-a variables in the search list and were satisfied. Furthermore, the controller 100 may find the degree-b variable nodes that are connected to these satisfied equations and increase their distance-2 weights by a set value (e.g., 1).

In the operation 1330, the controller 100 may find the degree-b variables connected to this check equation and add it to a second search list.

In the operation 1340, the controller 100 may extract the subgraphs with the degree-a variable nodes in the first search list and the degree-b variables with distance-2 weight more than 1. Further, the controller 100 may add the degree-b variable nodes that show up in the second search list that have at least weights of 1 for distance-2.

It has been observed that, when this subgraph extraction scheme 1300 is applied, 96.6% of the error patterns were successfully decoded using the mini-MS decoder 830 that is followed by the BF decoder 810. The subgraph extraction scheme 1300 may be generalized for different degree distributions as well as different distances from the unsatisfied check equations.

As described above, embodiments provide a scheme for replacing a higher precision decoder among two decoders in a decoding device with a reinforced decoder which operates over a subgraph among the entire bipartite graph. Thus, embodiments may reduce the gate counts and peak power in the decoding device while keeping energy consumption low.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims. Furthermore, the embodiments may be combined to form additional embodiments.

What is claimed is:

1. A system comprising:
    a memory device storing data encoded with an error correction code; and
    a controller including a first decoder with a first precision and a second decoder with a second precision greater than the first precision,
    wherein the controller is configured to:
    control the first decoder to decode the data read from the memory device by using a parity check matrix for the error correction code;
    extract one or more subgraphs from the entire bipartite graph of the parity check matrix, which is defined by a plurality of variable nodes and a plurality of check nodes when a particular condition is satisfied, the one or more subgraphs to be extracted based on unsatisfied check nodes and neighbors selected from among multiple neighbors of satisfied check nodes; and
    control the second decoder to decode the decoding result of the first decoder using a submatrix of the parity check matrix corresponding to the extracted subgraphs.

2. The system of claim 1, wherein the first decoder includes a bit-flipping (BF) decoder and the second decoder includes a min-sum (MS) decoder.

3. The system of claim 1, wherein the particular condition includes when a checksum along consecutive decoding iterations using the first decoder is less than a threshold.

4. The system of claim 1, wherein the particular condition includes when an oscillation of the first decoder is detected.

5. The system of claim 1, wherein the selected neighbors have a set distance from the unsatisfied check nodes.

6. The system of claim 1, wherein each of the subgraphs includes a first group of variable nodes connected to the unsatisfied check nodes and a second group of variable nodes connected to the satisfied check nodes and being neighbors from the first group of variable nodes with a distance-1 or a distance-2.

7. The system of claim 1, wherein the first group of variable nodes include variable nodes with a first distribution from the unsatisfied check nodes and the second group of variable nodes include variable nodes with a second distribution from the unsatisfied check nodes and a distance-2 weight from the first group of variable nodes.

8. The system of claim 1, wherein the controller terminates a decoding operation when a maximum number of iterations for the first decoder is reached.

9. A method for operating a system including a memory device storing data encoded with an error correction code and a controller, the method comprising:
controlling a first decoder with a first precision to decode the data read from the memory device, by using a parity check matrix for the error correction code;
extracting one or more subgraphs from the entire bipartite graph of the parity check matrix, which is defined by a plurality of variable nodes and a plurality of check nodes when a particular condition is satisfied, the one or more subgraphs to be extracted based on unsatisfied check nodes and neighbors selected from among multiple neighbors of satisfied check nodes; and
controlling a second decoder with a second precision greater than the first precision to decode the decoding result of the first decoder using a submatrix of the parity check matrix corresponding to the extracted subgraphs.

10. The method of claim 9, wherein the first decoder includes a bit-flipping (BF) decoder and the second decoder includes a min-sum (MS) decoder.

11. The method of claim 9, wherein the particular condition includes when a checksum along consecutive decoding iterations using the first decoder is less than a threshold.

12. The method of claim 9, wherein the particular condition includes when an oscillation of the first decoder is detected.

13. The method of claim 9, wherein the selected neighbors have a set distance from the unsatisfied check nodes.

14. The method of claim 9, wherein each of the subgraphs includes a first group of variable nodes connected to the unsatisfied check nodes and a second group of variable nodes connected to the satisfied check nodes and being neighbors from the first group of variable nodes with a distance-1 or a distance-2.

15. The method of claim 9, wherein the first group of variable nodes include variable nodes with a first distribution from the unsatisfied check nodes and the second group of variable nodes include variable nodes with a second distribution from the unsatisfied check nodes and a distance-2 weight from the first group of variable nodes.

16. The method of claim 9, further comprising terminating a decoding operation when a maximum number of iterations for the first decoder is reached.

* * * * *